(12) United States Patent
Chen et al.

(10) Patent No.: US 12,550,510 B2
(45) Date of Patent: Feb. 10, 2026

(54) DISPLAY DEVICE

(71) Applicant: Hubei Yangtze Industrial Innovation Center Of Advanced Display Co., Ltd., Wuhan (CN)

(72) Inventors: Donghua Chen, Wuhan (CN); Kaikai Zhang, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 617 days.

(21) Appl. No.: 17/977,489

(22) Filed: Oct. 31, 2022

(65) Prior Publication Data

US 2023/0059616 A1   Feb. 23, 2023

(30) Foreign Application Priority Data

Jun. 30, 2022   (CN) .......................... 202210770804.4

(51) Int. Cl.
  *H10H 20/858*   (2025.01)
  *H01L 25/075*   (2006.01)
  *H01L 25/16*    (2023.01)

(52) U.S. Cl.
  CPC ..... *H10H 20/8586* (2025.01); *H01L 25/0753* (2013.01); *H01L 25/167* (2013.01)

(58) Field of Classification Search
  CPC .............. H10H 20/8586; H10H 20/857; H01L 25/0753; H01L 25/167
  See application file for complete search history.

(56) References Cited

U.S. PATENT DOCUMENTS

| | | | |
|---|---|---|---|
| 2003/0231271 A1* | 12/2003 | Saitoh | G02F 1/133385 349/122 |
| 2007/0084585 A1* | 4/2007 | Takagi | H01L 23/473 257/E23.098 |
| 2010/0177519 A1* | 7/2010 | Schlitz | F21V 29/70 417/48 |

FOREIGN PATENT DOCUMENTS

| CN | 1469164 A    | 1/2004  |
|----|--------------|---------|
| CN | 209625140 U  | 11/2019 |
| CN | 211265470 U  | 8/2020  |
| CN | 112669717 A  | 4/2021  |

* cited by examiner

*Primary Examiner* — Jonathan Han
(74) *Attorney, Agent, or Firm* — KDW FIRM PLLC

(57) ABSTRACT

Provided is a display device including a display panel and a fluid heat dissipation module which includes a circulation cooling assembly and at least one heat dissipation assembly. A heat dissipation assembly includes a first fluid cavity adjacent to a first surface of the display panel and a second fluid cavity adjacent to a second surface of the display panel. The first fluid cavity communicates with the second fluid cavity. The heat dissipation assembly includes at least one fluid inlet disposed on an end of the first fluid cavity and at least one fluid outlet disposed on an end of the second fluid cavity. A fluid inlet and a fluid outlet are each connected to the circulation cooling assembly. The first fluid cavity of the heat dissipation assembly and the second fluid cavity of the heat dissipation assembly are adjacent to two surfaces of the display panel.

19 Claims, 8 Drawing Sheets

DISPLAY DEVICE

CROSS-REFERENCE TO RELATED APPLICATION(S)

This application claims priority to Chinese Patent Application No. 202210770804.4 filed Jun. 30, 2022, the disclosure of which is incorporated herein by reference in its entirety.

TECHNICAL FIELD

Embodiments of the present disclosure relate to the display technology and, in particular, to a display device.

BACKGROUND

With the development of display technology, display screens have been widely applied in production and daily life. For example, with an increasing number of functions, smartphones are more and more widely used and have become essential electronic devices in people's daily life.

However, a display screen may generate relatively much heat in use, affecting both the display effect of the display screen and the service life of the display screen.

SUMMARY

The present disclosure provides a display device. With the arrangement of a heat dissipation assembly and a circulation cooling assembly that are in a fluid heat dissipation module, the heat on surfaces of a display panel and adjacent to the heat dissipation assembly is dissipated, guaranteeing the display effect of the display panel and preventing excessive heat from affecting the service life of the display panel.

Embodiments of the present disclosure provide a display device. The display device includes a display panel and a fluid heat dissipation module. The fluid heat dissipation module includes a circulation cooling assembly and at least one heat dissipation assembly.

A heat dissipation assembly includes a first fluid cavity adjacent to a first surface of the display panel and a second fluid cavity adjacent to a second surface of the display panel. The first fluid cavity communicates with the second fluid cavity.

The heat dissipation assembly includes at least one fluid inlet disposed on an end of the first fluid cavity and at least one fluid outlet disposed on an end of the second fluid cavity. A fluid inlet and a fluid outlet are each connected to the circulation cooling assembly.

The display device provided in embodiments of the present disclosure includes the display panel and the fluid heat dissipation module. The fluid heat dissipation module includes the circulation cooling assembly and the at least one heat dissipation assembly. The first fluid cavity and the second fluid cavity that are included in a heat dissipation assembly are adjacent to two surfaces of the display panel. Then the fluid inlet and the fluid outlet that are connected to the circulation cooling assembly are disposed in the heat dissipation assembly. With the arrangement of the fluid heat dissipation module, the heat generated in the display panel is effectively dissipated through the first fluid cavity and the second fluid cavity, preventing excessive heat from affecting the service life of the display panel.

DETAILED DESCRIPTION

Figure 1:
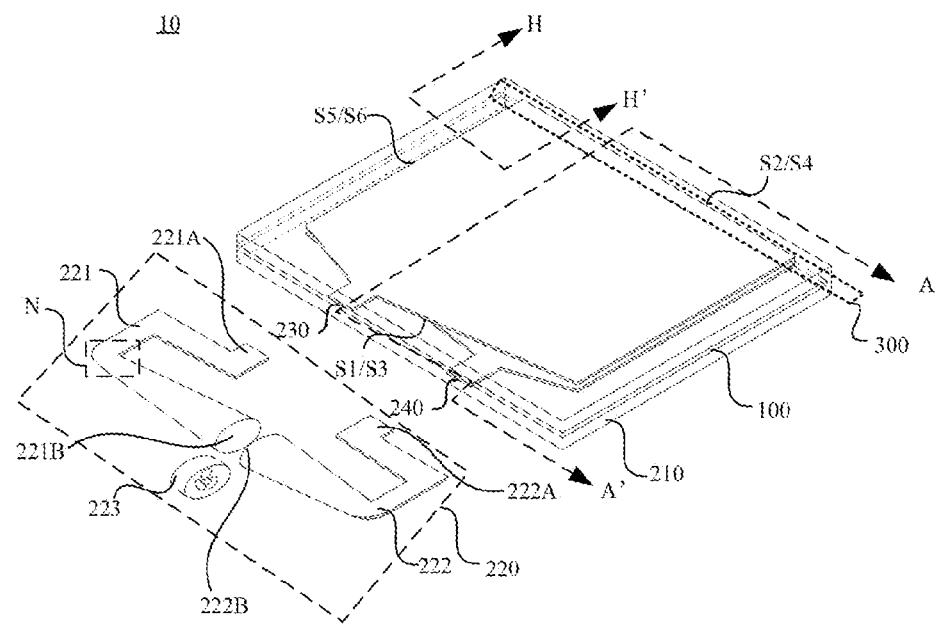
FIG. 1 is a diagram illustrating the structure of a display device according to an embodiment of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that, for ease of description, only part, not all, of structures related to the present disclosure are illustrated in the drawings.

It is obvious for those skilled in the art that various modifications and changes in the present disclosure may be made without departing from the spirit or scope of the present disclosure. Accordingly, the present disclosure is intended to cover modifications and variations of the present disclosure that fall within the scope of the corresponding claims (the claimed technical solutions) and their equivalents. It is to be noted that embodiments of the present disclosure, if not in collision, may be combined with each other.

Figure 2:
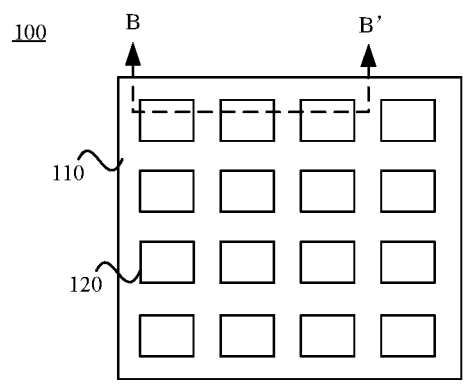
FIG. 2 is a diagram illustrating the structure of a display panel according to an embodiment of the present disclosure.
Figure 3:
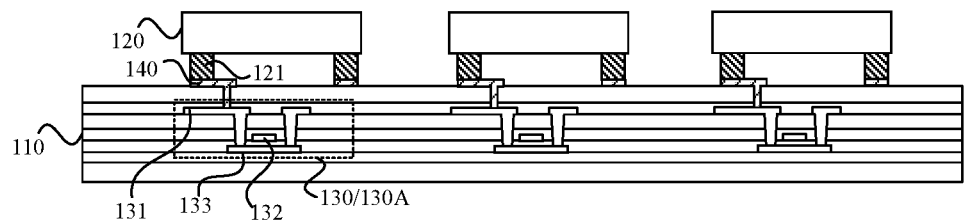
FIG. 3 is a diagram illustrating a structure taken along section line BB' of FIG. 2.
Figure 4:
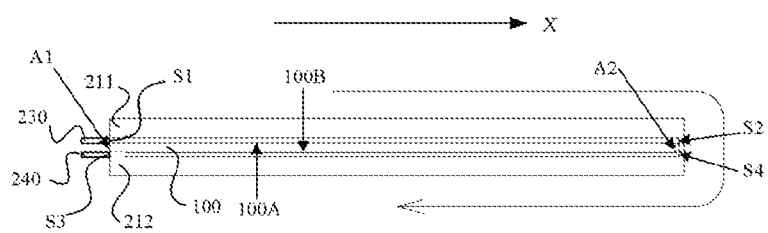
FIG. 4 is a diagram illustrating a structure taken along line AA' of FIG. 1.

FIG. 1 is a diagram illustrating the structure of a display device according to an embodiment of the present disclosure. FIG. 2 is a diagram illustrating the structure of a display panel according to an embodiment of the present disclosure. FIG. 3 is a diagram illustrating a structure taken along section line BB' of FIG. 2. FIG. 4 is a diagram illustrating a structure taken along line AA' of FIG. 1. Referring to FIGS. 1 and 4, a display device 10 provided in embodiments of the present disclosure includes a display panel 100 and a fluid heat dissipation module 200. The fluid heat dissipation module 200 includes a circulation cooling assembly 220 and at least one heat dissipation assembly 210. A heat dissipation assembly 210 includes a first fluid cavity 211 adjacent to a first surface 100A of the display panel 100 and a second fluid cavity 212 adjacent to a second surface 100B of the display panel 100. The first fluid cavity 211 communicates with the second fluid cavity 212. The heat dissipation assembly 210 includes at least one fluid inlet 230 disposed on an end of the first fluid cavity 211 and at least one fluid outlet 240 disposed on an end of the second fluid cavity 212. A fluid inlet 230 and a fluid outlet 240 are each connected to the circulation cooling assembly 220.

As shown in FIG. 1, the display device 10 includes the display panel 100 used for implementing the display function of the display device 10. In an embodiment, the display device 10 may be any electronic product with a display function, including but not limited to: a television, a laptop, a desktop display, a tablet computer, a digital camera, a smart bracelet, a smart glass, a vehicle-mounted display, medical equipment, industrial control equipment, and a touch interactive terminal. No special limitations are made thereto in embodiments of the present disclosure.

In an embodiment, as shown in FIGS. 2 and 3, the display panel 100 includes a driving substrate 110 and a plurality of light-emitting elements 120. The light-emitting elements 120 are located on a side of the driving substrate 110 and are electrically connected to the driving substrate 110 so that the light-emitting elements 120 are driven to emit light. Further, the driving substrate 110 further includes a plurality of driver circuits 130 corresponding to the light-emitting elements 120. The light-emitting elements 120 are driven by the driver circuits 130 to emit light. In an embodiment, the driver circuits 130 may include at least one thin-film transistor 130A. A thin-film transistor 130A includes a source-drain 131, a gate 132, and an active layer 133. Moreover, an electrode structure 121 of a light-emitting element 120 is electrically connected to a connection structure 140 so that the driven light emission of the light-emitting element 120 is implemented specifically. Moreover, the driving substrate 110 includes an insulating layer and a metal layer that are disposed alternately, for example, a first metal layer, a buffer layer, a gate insulating layer, an active layer, an intermetallic insulating layer, a second metal layer, an interlayer insulating layer, a capacitor plate layer, a third metal layer, a first insulating layer, a first planarization layer, and a pixel defining layer. In an embodiment, embodiments of the driver circuits 130 and each layer may be set by those skilled in the art according to practical situations, which is not limited here. The display effect of the display panel 100 is implemented by driving the light-emitting elements 120 to emit light. However, the light-emitting elements 120 generate relatively much heat in the process of light emission. The heat affects both the service life of the light-emitting elements 120 and the service life of components driving the light-emitting elements 120 to emit light in the display panel 100. In embodiments of the present disclosure, the heat generated by the light-emitting elements 120 is dissipated timely through the heat dissipation assembly, prolonging the service life of the light-emitting elements 120 and guaranteeing the display effect of the display device 10.

In an embodiment, as shown in FIG. 1, the display device 10 further includes the fluid heat dissipation module 200. With the function of heat dissipation, the fluid heat dissipation module 200 is in contact with the display panel 100 so as to effectively and timely dissipate the heat generated in the display panel 100, guaranteeing that the service life of the display panel 100 is not affected due to relatively much heat.

Further, the fluid heat dissipation module 200 includes the circulation cooling assembly 220 and the heat dissipation assembly 210. The heat dissipation assembly 210 is in contact with the display panel 100. A heat dissipation medium flowing in the heat dissipation assembly 210 absorbs the heat generated in the display panel 100 and circularly flows to the circulation cooling assembly 220 to dissipate the heat, preventing the display panel 100 from working at a relatively high temperature. Moreover, the circulation cooling assembly 220 and the heat dissipation assembly 210 are connected to each other, dissipating the heat absorbed by the heat dissipation assembly 210. Meanwhile, a power of fluid flow is provided for the heat dissipation assembly 210 circularly dissipating the heat of the display panel 100, guaranteeing that the display panel 100 can work continuously in a low-temperature environment, and improving the service life of the display panel 100.

In an embodiment, the heat dissipation assembly 210 includes the first fluid cavity 211 and the second fluid cavity 212. Adjacent to the surfaces of the display panel 100, the first fluid cavity 211 and the second fluid cavity 212 absorb the heat generated on the surfaces of the display panel 100 and take away the heat through flow. The display panel 100 includes the first surface 100A and the second surface 100B. The first surface 100A and the second surface 100B are two surfaces opposite to each other. One of the first surface 100A or the second surface 100B may serve as a light emission surface of the display panel 100, that is, a display surface through which the display function of the display panel 100 is implemented. The other of the first surface 100A or the second surface 100B is a light non-emission panel corresponding to the light emission surface in the display panel 100, that is, a non-display surface. No specific limitations are made thereto in embodiments of the present disclosure. Further, the heat generated on the first surface 100A is absorbed and taken away by the first fluid cavity 211. The heat generated on the second surface 100B is absorbed and taken away by the second fluid cavity 212. Moreover, the first fluid cavity 211 communicates with the second fluid cavity 212, guaranteeing the flow of the heat dissipation medium in the heat dissipation assembly 210, guaranteeing the absorption of the heat in the display panel 100, and preventing the heat dissipation medium from being static in the heat dissipation assembly 210 to get the heat concentrated and not dissipated. Further, the heat dissipation assembly 210 further includes the fluid inlet 230 and the fluid outlet 240. The fluid inlet 230 and the fluid outlet 240 implement the circular flow of the heat dissipation medium in the heat dissipation assembly 210, that is, enable the heat dissipation assembly 210 to dissipate the heat in the display panel 100. The heat dissipation assembly 210 is connected to the circulation cooling assembly 220 through the fluid inlet 230 and the fluid outlet 240, guaranteeing the heat dissipation of the heat dissipation assembly 210 and the circulation cooling assembly 220. That is, the fluid heat dissipation module 200 helps effectively dissipate the heat generated in the display panel 100 through the first fluid cavity 211 and the second fluid cavity 212, preventing excessive heat from affecting the service life of the display panel 100. Moreover, compared with an existing display device in which structures such as a heat dissipation plate and a fan are added to a display panel or a non-display region of the display panel, the display device 10 provided in embodiments of the present disclosure saves more arrangement space; additionally, the heat dissipation assembly 210 may be disposed on the light emission and display surface of the display panel 100, improving the heat dissipation effect of the display panel 100.

In all, the display device provided in embodiments of the present disclosure includes the display panel and the fluid heat dissipation module. With the arrangement of the fluid heat dissipation module, the heat generated in the display panel is effectively dissipated through the first fluid cavity and the second fluid cavity, preventing excessive heat from affecting the service life of the display panel.

In an embodiment, the first fluid cavity 211 is a transparent structure. The first fluid cavity 211 is adjacent to the light emission surface of the display panel 100.

In an embodiment, the first fluid cavity 211 is located on the light emission surface of the display panel 100. When the first fluid cavity 211 is a transparent structure, the first fluid cavity 211 does not affect the display of the display panel 100. That is, in the case of guaranteeing the display effect of the display panel 100, the heat generated in the display panel 100 is dissipated through the first fluid cavity 211.

The first fluid cavity 211 and the second fluid cavity 212 are each a transparent structure. The display panel 100 is a transparent display panel.

In an embodiment, the first fluid cavity 211 and the second fluid cavity 212 are located on two sides of the display panel 100. When the display panel 100 is a transparent display panel, it is required that the first fluid cavity 211 and the second fluid cavity 212 do not block the display panel 100 and do not affect the display effect of the display panel 100. In an embodiment, the first fluid cavity 211 and the second fluid cavity 212 are each a transparent structure. That is, in the case of guaranteeing the display effect of the display panel 100, the heat generated in the display panel 100 is dissipated through the first fluid cavity 211. The transparent display panel may be used in fields including window display and vehicle display.

In an embodiment, referring to FIG. 3, the display panel 100 is a self-luminous display panel. The self-luminous display panel includes a plurality of light-emitting elements.

In FIG. 3, an example of three light-emitting elements 120 is taken for illustration. The light-emitting elements 120 include at least one of organic light-emitting diodes, sub-millimeter light-emitting diodes, or micro light-emitting diodes. No specific limitations are made to the type of the light-emitting elements 120 in embodiments of the present disclosure.

Figure 5:
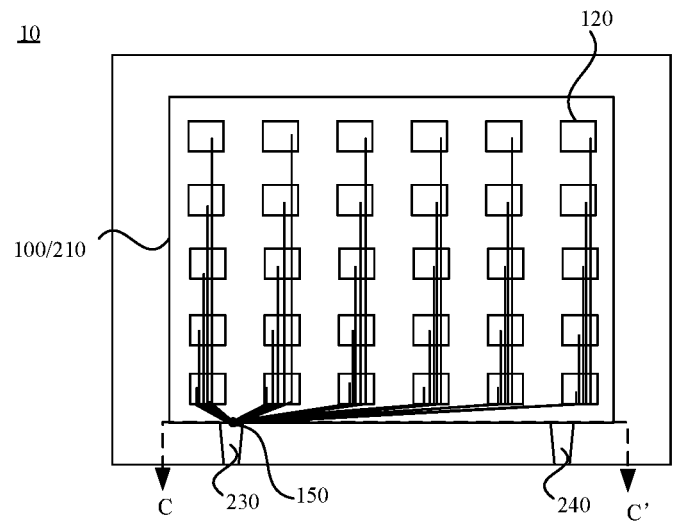
FIG. 5 is a top view illustrating the structure of a display device according to an embodiment of the present disclosure.
Figure 6:
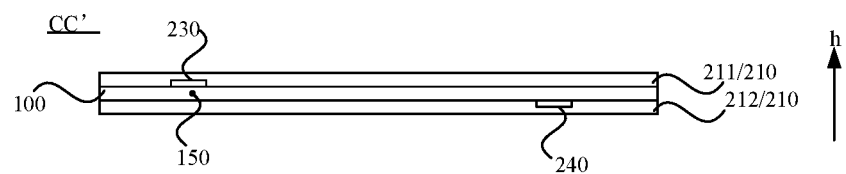
FIG. 6 is a diagram illustrating a structure taken along line CC' of FIG. 5.
Figure 7:
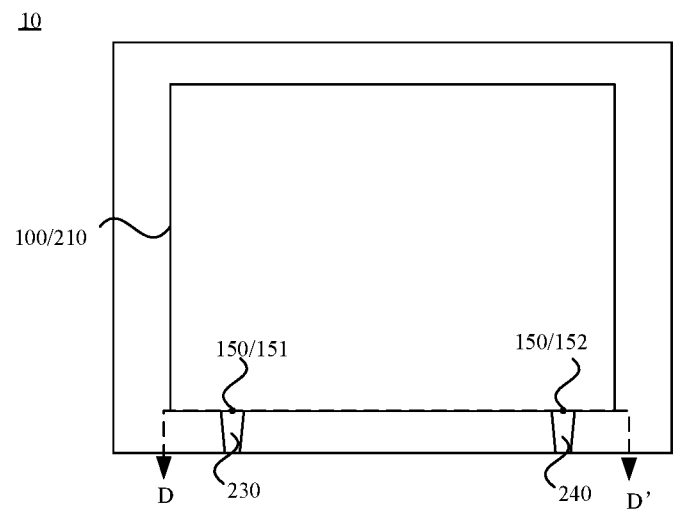
FIG. 7 is a top view illustrating the structure of a display device according to an embodiment of the present disclosure.
Figure 8:
FIG. 8 is a diagram illustrating a structure taken along line DD' of FIG. 7.

FIG. 5 is a top view illustrating the structure of a display device according to an embodiment of the present disclosure. FIG. 6 is a diagram illustrating a structure taken along line CC' of FIG. 5. FIG. 7 is a top view illustrating the structure of a display device according to an embodiment of the present disclosure. FIG. 8 is a diagram illustrating a structure taken along line DD' of FIG. 7. Referring to FIGS. 5 to 7, the display panel 100 includes a signal input terminal 150 located on an end of the display panel 100. In a direction h perpendicular to a plane where the display panel 100 is located, at least one of the fluid inlet 230 or the fluid outlet 240 at least partially overlaps the signal input terminal 150.

In an embodiment, the display panel 100 includes the signal input terminal 150 through which the light-emitting elements 120 are driven to emit light. Moreover, the signal input terminal 150 is a position where a set of signal lines electrically connecting the light-emitting elements 120 to a driver chip are located. That is, the fan-out of a signal line of the driver chip is implemented through the signal input terminal 150. That is, the signal line may be, for example, a data signal line, a touch signal line, or a power voltage signal line. No specific limitations are made thereto in embodiments of the present disclosure. Referring to FIG. 5, signal line segments at the position of the signal input terminal 150 have a high density and generate relatively much heat. That is, the heat dissipation assembly 210 dissipates the heat at the position of the signal input terminal 150 so as to further improve the effect of the heat dissipation performed by the fluid heat dissipation module 200 on the display panel 100.

In an embodiment, the heat dissipation medium flowing in the heat dissipation assembly 210 also flows through the fluid inlet 230 in the heat dissipation assembly 210 and the fluid outlet 240 in the heat dissipation assembly 210. That is, the fluid inlet 230 and the fluid outlet 240 also have the function of heat dissipation. Moreover, the heat dissipation medium has a relatively large flow rate at the fluid inlet 230 and the fluid outlet 240; meanwhile, the heat dissipation medium does not absorb heat before reaching the fluid inlet 230. That is, the heat dissipation effect at the fluid inlet 230 and the fluid outlet 240 is relatively good. The signal input terminal 150 partially overlaps the fluid inlet 230 and the fluid outlet 240, guaranteeing that the heat generated by the signal input terminal 150 is dissipated timely. In an embodiment, as shown in FIG. 6, the signal input terminal 150 partially overlaps the fluid inlet 230. Further, the signal input terminal 150 may also partially overlap the fluid outlet 240 (not shown). In an embodiment, as shown in FIG. 8, when two signal input terminals 150 are provided, one signal input terminal 150 partially overlaps the fluid inlet 230, and the other signal input terminal 150 partially overlaps the fluid outlet 240. No specific limitations are made thereto in embodiments of the present disclosure.

With continued reference to FIGS. 7 and 8, the signal input terminals 150 include a first signal input terminal 151 and a second signal input terminal 152. In the direction h perpendicular to the plane where the display panel 100 is located, the fluid inlet 230 at least partially overlaps the first signal input terminal 151, and the fluid outlet 240 at least partially overlaps the second signal input terminal 152.

The signal input terminals 150 include the first signal input terminal 151 and the second signal input terminal 152. The appropriate addition of signal input terminals 150 may guarantee that the heat generated at the positions of the signal input terminals 150 is dissipated.

Further, as shown in FIGS. 7 and 8, the first signal input terminal 151 partially overlaps the fluid inlet 230; that is, the fluid inlet 230 may dissipate the heat generated by the first signal input terminal 151. The second signal input terminal 152 partially overlaps the fluid outlet 240; that is, the fluid outlet 240 may dissipate the heat generated by the second signal input terminal 152. That is, the heat dissipation assembly 210 may dissipate both the heat on the surfaces of the display panel 100 and the heat generated at the positions of the signal input terminals 150. Moreover, in the case of multiple signal input terminals 150, the heat dissipation performed on each signal input terminal 150 is guaranteed, improving the heat dissipation effect of the display panel 100 in the display device 10.

Figure 9:
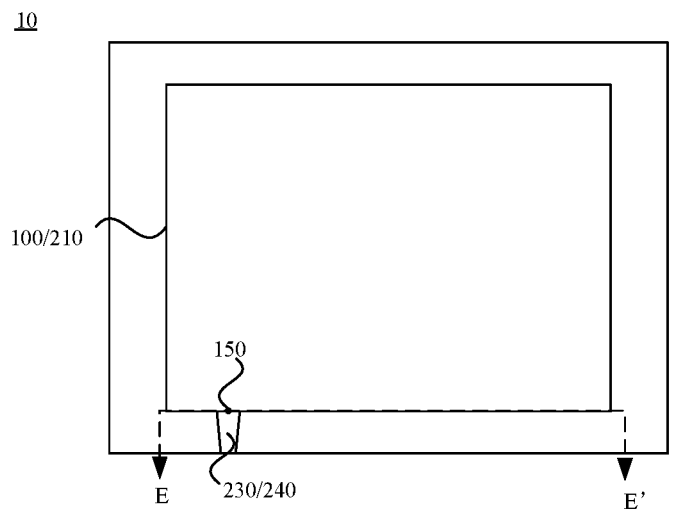
FIG. 9 is a top view illustrating the structure of a display device according to an embodiment of the present disclosure.
Figure 10:
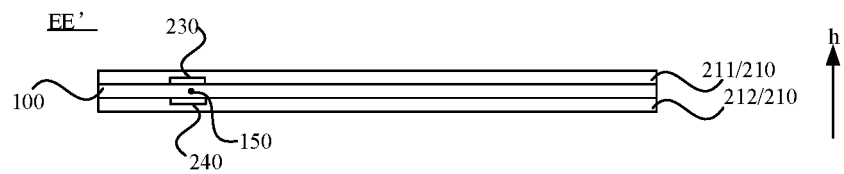
FIG. 10 is a diagram illustrating a structure taken along line EE' of FIG. 9.

FIG. 9 is a top view illustrating the structure of a display device according to an embodiment of the present disclosure. FIG. 10 is a diagram illustrating a structure taken along line EE' of FIG. 9. Referring to FIGS. 5 to 10, in the direction h perpendicular to the plane where the display panel 100 is located, at least one of the fluid inlet 230 or the fluid outlet 240 completely covers a signal input terminal 150.

Relatively much heat is generated at the position of the signal input terminal 150. In the case of guaranteeing that at least one of the fluid inlet 230 or the fluid outlet 240 completely covers the signal input terminal 150, the heat guaranteed in the display panel 100 may be dissipated effectively, improving the service life of the display panel 100 in the display device 10.

As shown in FIGS. 5 and 6, the signal input terminal 150 overlaps only the fluid inlet 230; that is, the heat generated by the signal input terminal 150 may be dissipated through the fluid inlet 230. As shown in FIGS. 9 and 10, the signal input terminal 150 overlaps both the fluid inlet 230 and the fluid outlet 240; that is, the heat generated by the signal input terminal 150 may be dissipated through both the fluid inlet 230 and the fluid outlet 240. Referring to FIGS. 7 and 8, in the case where more than one signal input terminal 150 is provided and a distance exists between different signal input terminals 150, the signal input terminals 150 overlap the fluid inlet 230 and the fluid outlet 240. No specific limitations are made thereto in embodiments of the present disclosure. Moreover, in FIGS. 7 and 8, the fluid inlet 230 is configured to be misaligned with the fluid outlet 240. That is, in the direction h perpendicular to the plane where the display panel 100 is located, the fluid inlet 230 does not overlap the fluid outlet 240. In FIGS. 9 and 10, the fluid inlet 230 is configured to overlap the fluid outlet 240. That is, in the direction h perpendicular to the plane where the display panel 100 is located, the fluid inlet 230 overlaps the fluid outlet 240. In all, based on the requirements of dissipating the heat of the signal input terminals 150, the position of the fluid inlet 230 and the position of the fluid outlet 240 may be adjusted adaptively. No specific limitations are made to specific positions in embodiments of the disclosure.

Figure 11:
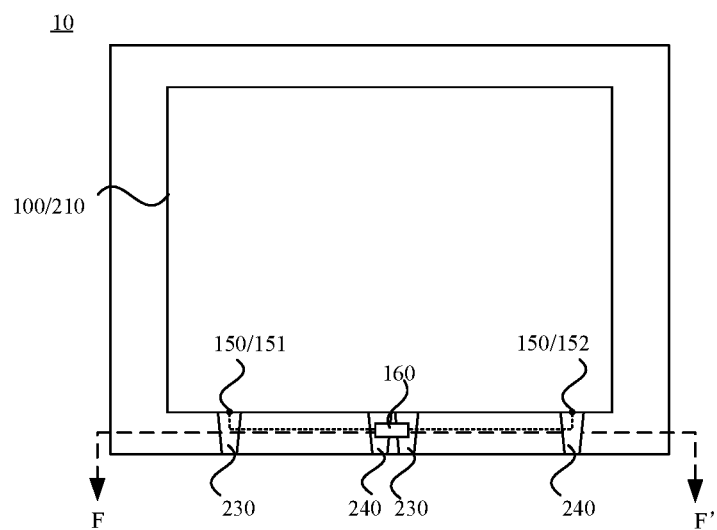
FIG. 11 is a top view illustrating the structure of another display device according to an embodiment of the present disclosure.
Figure 12:
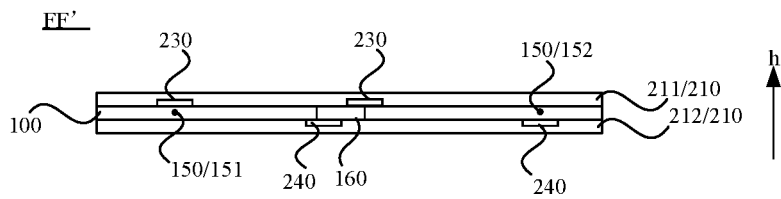
FIG. 12 is a diagram illustrating a structure taken along line FF' of FIG. 11.

FIG. 11 is a top view illustrating the structure of another display device according to an embodiment of the present disclosure. FIG. 12 is a diagram illustrating a structure taken along line FF' of FIG. 11. Referring to FIGS. 11 and 12, the display panel 100 further includes a driver chip 160. The first signal input terminal 151 and the second signal input terminal 152 are each electrically connected to the driver chip 160. The projection of the driver chip 160 on the display panel 100 is located between the projection of the first signal input terminal 151 on the display panel 100 and the projection of the second signal input terminal 152 on the display panel 100. In the direction h perpendicular to the plane where the display panel 100 is located, at least one of the fluid inlet 230 or the fluid outlet 240 at least partially overlaps the driver chip 160.

In an embodiment, the display panel 100 further includes the driver chip 160. The driver chip 160 is used for driving the light-emitting elements (not shown) in the display panel 100 to emit light. That is, the arrangement in which the driver chip 160 is electrically connected to the first signal input terminal 151 and the second signal input terminal 152 enables the driver chip 160 to drive the light-emitting elements in the display panel 100 to emit light.

Further, when driving the light-emitting elements in the display panel 100, the driver chip 160 also generates heat. The heat may affect the display panel 100. The heat dissipation by the fluid heat dissipation module 200 prevents the heat from affecting, for example, the display of the display panel 100 and the service life of the display panel 100. In an embodiment, the position of the fluid inlet 230 or the position of the fluid outlet 240 is adjusted and controlled so as to guarantee that the fluid inlet 230 or the fluid outlet 240 overlaps the driver chip 160, thereby dissipating the heat generated by the driver chip 160. In an embodiment, as shown in FIG. 12, a fluid inlet 230 and a fluid outlet 240 overlap the first signal input terminal 151 and the second signal input terminal 152 respectively, and another fluid inlet 230 and another fluid outlet 240 each overlap the driver chip 160. That is, the effect of the heat dissipation performed by the fluid heat dissipation module 200 is guaranteed. In an embodiment, the driver chip 160 may also overlap only one of the fluid inlet 230 or the fluid outlet 240. No specific limitations are made thereto in embodiments of the present disclosure.

Figure 13:
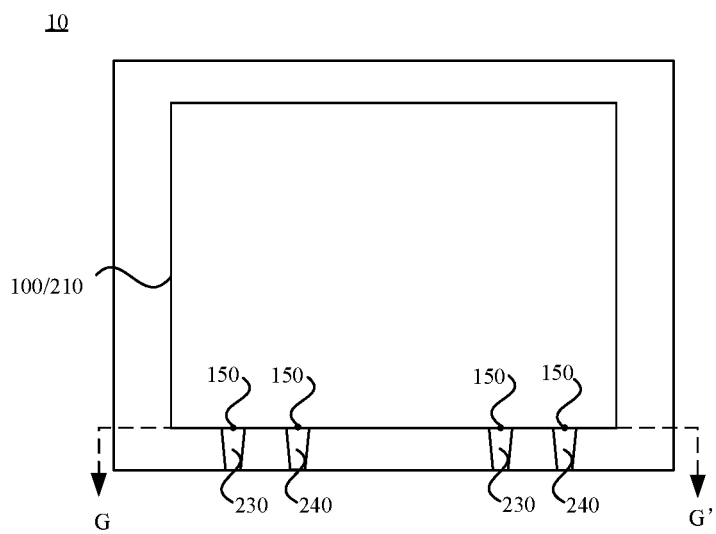
FIG. 13 is a top view illustrating the structure of another display device according to an embodiment of the present disclosure.
Figure 14:
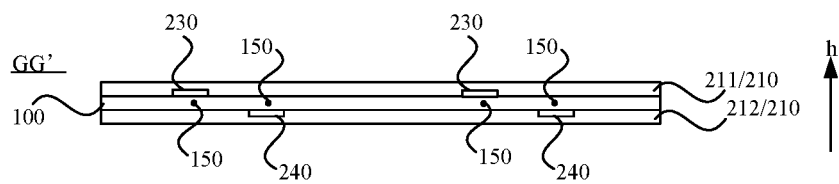
FIG. 14 is a diagram illustrating a structure taken along line GG' of FIG. 13.
Figure 15:
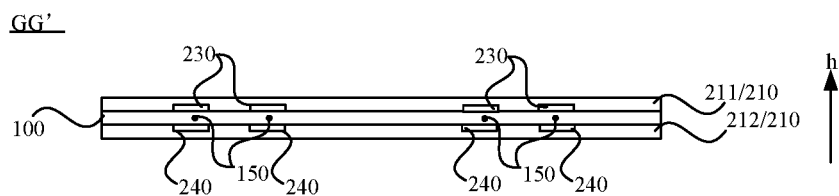
FIG. 15 is a diagram illustrating another structure taken along line GG' of FIG. 13.

FIG. 13 is a top view illustrating the structure of another display device according to an embodiment of the present disclosure. FIG. 14 is a diagram illustrating a structure taken along line GG' of FIG. 13. FIG. 15 is a diagram illustrating another structure taken along line GG' of FIG. 13. Referring to FIGS. 13 to 15, the number of signal input terminals is a. The number of the at least one fluid inlet is b. The number of the at least one fluid outlet is c. a=b+c. a is an integer greater than 2. b is an integer greater than or equal to 1. c is an integer greater than or equal to 1.

As shown in FIGS. 13 and 14, the number of signal input terminals 150 is equal to the sum of the number of the at least one fluid inlet 230 and the number of the at least one fluid outlet 240, guaranteeing that a signal input terminal 150 overlaps a fluid inlet 230 or a fluid outlet 240. That is, the heat of each signal input terminal 150 is dissipated through the heat dissipation assembly 210, improving the heat dissipation effect of the display panel 100. In an embodiment, the number of signal input terminals 150, the number of the at least one fluid inlet 230, and the number of the at least one fluid outlet 240 are a, b, and c respectively. a=b+c. Referring to FIG. 14, four signal input terminals 150, two fluid inlets 230, and two fluid outlets 240 are provided. No limitations are made to the number of signal input terminals 150, the number of the at least one fluid inlet 230, and the number of the at least one fluid outlet 240 in embodiments of the present disclosure.

Further, referring to FIG. 15, to further improve the effect of the heat dissipation performed by the fluid inlets 230 and the fluid outlets 240 on the signal input terminals 150, it guarantees that each signal input terminal 150 overlaps a fluid inlet 130 and a fluid outlet 240, better improving the heat dissipation effect of the display panel 100.

With continued reference to FIG. 4, the first fluid cavity 211 includes a first end S1 and a second end S2 disposed opposite to each other in a first direction X. The second fluid cavity 212 includes a third end S3 and a fourth end S4 disposed opposite to each other in the first direction X. The fluid inlet 230 is connected to the first end S1 of the first fluid cavity 211. The fluid outlet 240 is connected to the third end S3 of the second fluid cavity 212. The second end S2 of the first fluid cavity 211 communicates with the fourth end S4 of the second fluid cavity 212. The first end S1 of the first fluid cavity 211 and the third end S3 of the second fluid cavity 212 are each adjacent to a first end A1 of the display panel 100. The second end S2 of the first fluid cavity 211 and the fourth end S4 of the second fluid cavity 212 are each adjacent to a second end A2 of the display panel 100.

The first fluid cavity 211 includes the first end S1 and the second end S2 disposed opposite to each other in the first direction X. Moreover, the second fluid cavity 212 includes the third end S3 and the fourth end S4 disposed opposite to each other in the first direction X. The second end S2 communicates with the fourth end S4. That is, the first fluid cavity 211 communicates with the second fluid cavity 212, implementing the flow of the heat dissipation medium flowing in the heat dissipation assembly 210. Moreover, the first end S1 of the first fluid cavity 211 is connected to the fluid inlet 230. The third end S3 of the second fluid cavity 212 is connected to the fluid outlet 240. That is, the medium flowing in the heat dissipation assembly 210 may enter the first fluid cavity 211 through the fluid inlet 230, then enter the second fluid cavity 212 from the first fluid cavity 211, and finally pass through the second fluid cavity 212 to flow out of the fluid outlet 240, implementing the entire heat dissipation process of the heat dissipation assembly 210.

The first fluid cavity 211 and the second fluid cavity 212 are bonded to the display panel 100 to dissipate the heat of the display panel 100. In an embodiment, the first end S1 of the first fluid cavity 211 and the third end S3 of the second fluid cavity 212 are each adjacent to the first end A1 of the display panel 100. The second end S2 of the first fluid cavity 211 and the fourth end S4 of the second fluid cavity 212 are each adjacent to the second end A2 of the display panel 100. It guarantees that the heat dissipation assembly 210 is disposed around the display panel 100 and that the heat generated in the display panel 100 may be absorbed by the heat dissipation assembly 210 timely, preventing the excessively high temperature of the display panel 100 from affecting the life of the display panel 100.

Figure 16:
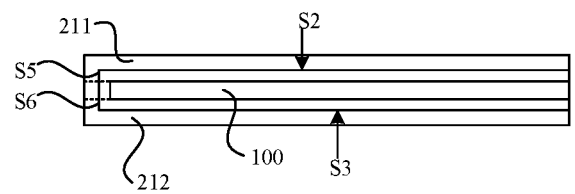
FIG. 16 is a diagram illustrating a structure taken along line HH' of FIG. 1.

FIG. 16 is a diagram illustrating a structure taken along line HH' of FIG. 1. With continued reference to FIGS. 1, 4, and 16, a fifth end S5 of the first fluid cavity 211 communicates with a sixth end S6 of the second fluid cavity 212. The fifth end S5 of the first fluid cavity 211 is adjacent to the second end S2 of the first fluid cavity 211. The sixth end S6 of the second fluid cavity 212 is adjacent to the fourth end S4 of the second fluid cavity 212.

The first fluid cavity 211 further includes the fifth end S5. The second fluid cavity 212 further includes the sixth end S6. Moreover, the fifth end S5 of the first fluid cavity 211 is adjacent to the second end S2 of the first fluid cavity 211. The sixth end S6 of the second fluid cavity 212 is adjacent to the fourth end S4 of the second fluid cavity 212. Referring to FIGS. 1, 4, and 16, the second end S2 and the fourth end S4 are located on an end of the heat dissipation assembly 210 facing away from the fluid inlet 230 and the fluid outlet 240. The fifth end S5 and the sixth end S6 are located on a side of the heat dissipation assembly 210 and are adjacent to the second end S2 and the fourth end S4 respectively.

In this case, the heat dissipation medium flowing in the heat dissipation assembly 210 may flow into the second fluid cavity 212 through the second end S2 of the first fluid cavity 211 and the fourth end S4 of the second fluid cavity 212 and may also flow into the second fluid cavity 212 through the fifth end S5 of the first fluid cavity 211 and the sixth end S6 of the second fluid cavity 212, enriching flow manners of the heat dissipation medium in the heat dissipation assembly 210 and improving the efficiency of the heat dissipation assembly 210 absorbing heat.

With continued reference to FIGS. 1, 4, and 16, the first fluid cavity 211 communicates with the second fluid cavity 212 integrally.

In an embodiment, referring to FIG. 1, the first fluid cavity 211 communicates with the second fluid cavity 212 at a communication position 300. That is, the first fluid cavity 211 communicates with the second fluid cavity 212 by connecting the second end S2 to the fourth end S4. Further, referring to FIGS. 1 and 16, the first fluid cavity 211 communicates with the second fluid cavity 212 by connecting the fifth end S5 to the sixth end S6. In an embodiment, the first fluid cavity 211 communicates with the second fluid cavity 212 by connecting the second end S2 to the fourth end S4 and by connecting the fifth end S5 to the sixth end S6. No specific limitations are made thereto in embodiments of the present disclosure.

The arrangement in which the first fluid cavity 211 communicates with the second fluid cavity 212 guarantees the flow of the heat dissipation medium in the heat dissipation assembly 210, that is, guarantees that the heat dissipation assembly 210 timely absorbs the heat generated in the display panel 100. Thus the heat is prevented from affecting the display of the display panel 100 and the service life of the display panel 100.

Further, the first fluid cavity 211 and the second fluid cavity 212 are connected to each other and form an accommodation structure in which at least a partial region of the display panel 100 is placed.

The first fluid cavity 211 and the second fluid cavity 212 are connected to each other and form the accommodation structure in which at least the partial region of the display panel 100 is placed, guaranteeing that the heat generated in the display panel 100 is absorbed timely in the accommodation structure by the heat dissipation assembly 210, thereby guaranteeing that the service life of the display panel 100 or the display effect of the display panel 100 is not affected by excessive heat. In an embodiment, the accommodation structure may be a U-shaped cavity formed by connecting the first fluid cavity 211 to the second fluid cavity 212 so that the display panel is placed in the accommodation structure. The first fluid cavity 211 and the second fluid cavity 212 are in contact with the light emission surface of the display panel and the light non-emission surface (back surface) of the display panel respectively. In an embodiment, a cavity structure in another form is formed. No specific limitations are made thereto in embodiments of the present disclosure as long as it guarantees that the display panel 100 is stably placed in the accommodation structure and that the heat of the display panel 100 is dissipated. Further, the accommodation structure may completely cover the surfaces of the display panel 100 or may cover part of the surfaces of the display panel 100. No specific limitations are also made thereto in embodiments of the present disclosure.

Figure 17:
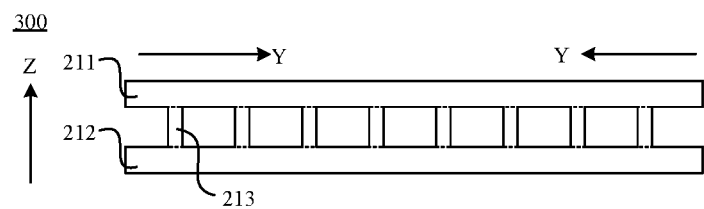
FIG. 17 is a diagram illustrating the structure of a communication position according to an embodiment of the present disclosure.
Figure 18:
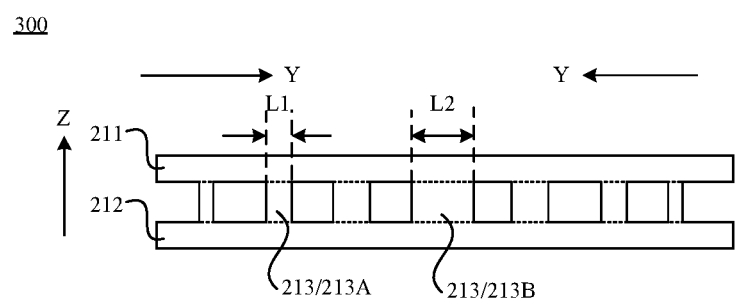
FIG. 18 is a diagram illustrating the structure of another communication position according to an embodiment of the present disclosure.

FIG. 17 is a diagram illustrating the structure of a communication position according to an embodiment of the present disclosure. FIG. 18 is a diagram illustrating the structure of another communication position according to an embodiment of the present disclosure. Referring to FIGS. 1, 17, and 18, the communication position 300 between the first fluid cavity 211 and the second fluid cavity 212 includes a plurality of communication pipes 213.

Referring to FIG. 1, the first fluid cavity 211 communicates with the second fluid cavity 212 at the communication position 300, guaranteeing the flow of the heat dissipation medium in the heat dissipation assembly 210. That is, the heat of the display panel 100 is absorbed dynamically.

In an embodiment, referring to FIGS. 17 and 18, the communication position 300 includes the communication pipes 213 through which the first fluid cavity 211 communicates with the second fluid cavity 212, guaranteeing that the fluid flowing into the first fluid cavity 211 may flow into the second fluid cavity 212. Moreover, the arrangement of the communication pipes 213 may improve the flow rate of the fluid between the first fluid cavity 211 and the second fluid cavity 212, guaranteeing the efficiency of the heat dissipation performed by the heat dissipation assembly 210 on the display panel 100.

With continued reference to FIG. 18, at least two communication pipes 213 have different sectional areas in a first section. The first section is perpendicular to an extension direction Z of the communication pipes 213.

In an embodiment, referring to FIG. 18, at least two communication pipes 213A and 213B are provided. The communication pipe 213A and the communication pipe 213B have different sectional areas in the first section. That is, the communication pipe 213A and the communication pipe 213B have different pipe diameters perpendicular to the extension direction Z of the communication pipe 213A and the communication pipe 213B. The fluid has different flow quantities at different communication positions between the first fluid cavity 211 and the second fluid cavity 212. That is, the arrangement of the communication pipes 213 with different sectional areas guarantees a more efficient flow of the fluid in the first fluid cavity 211 and in the second fluid cavity 212, guaranteeing the effect of the heat dissipation performed by the heat dissipation assembly 210 on the display panel 100.

In an embodiment, L1 and L2 denote the pipe diameter of the communication pipe 213A and the pipe diameter of the communication pipe 213B respectively. L1 is less than L2. That is, the sectional area of the communication pipe 213A is less than the sectional area of the communication pipe 213B. No specific limitations are made to the sectional area of a communication pipe 213 and the number of communication pipes in embodiments of the present disclosure.

Further, with continued reference to FIG. 18, sectional areas of the communication pipes 213 increase in sequence along a direction Y from two sides of the communication position 300 to the center of the communication position 300.

In an embodiment, based on the motion low of the fluid, that is, the "normal distribution" law that the flow quantities and flow rates of the fluid in the first fluid cavity 211 and in the second fluid cavities 212 satisfy, the flow quantity and flow rate of the fluid in the middle of the communication position 300 is greater than the flow quantity and flow rate of the fluid at an edge of the communication position 300. That is, the arrangement in which the communication pipes 213 have different pipe diameters, that is, sectional areas, at different parts of the communication position 300 implements different flow quantities and flow rates of the fluid in different communication pipes 213, more effectively guaranteeing a more efficient flow of the fluid in the first fluid cavity 211 and in the second fluid cavities 212, thereby guaranteeing the efficiency of the heat dissipation performed by the heat dissipation assembly 210 on the display panel 100.

In an embodiment, referring to FIG. 18, the sectional area of a communication pipe 213 in a middle region of the communication position 300 is greater than the sectional area of a communication pipe 213 in an edge region of the communication position 300. That is, the sectional area of the communication pipe 213A is less than the sectional area of the communication pipe 213B. The arrangement of the preceding two communication pipes 213A and 213B reflects an arrangement trend of the communication pipes 213. No specific limitations are made thereto in embodiments of the present disclosure.

Figure 19:
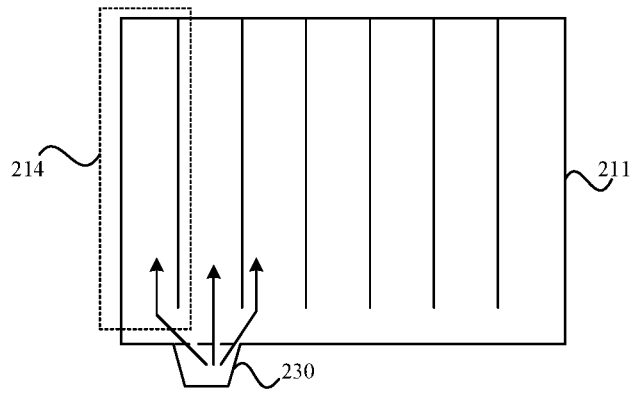
FIG. 19 is a diagram illustrating the structure of a heat dissipation assembly according to an embodiment of the present disclosure.
Figure 20:
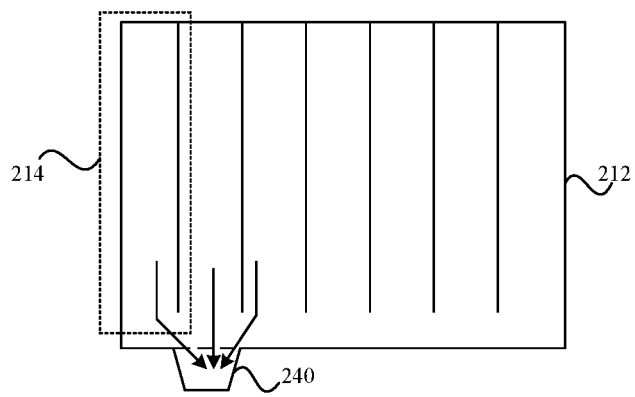
FIG. 20 is a diagram illustrating the structure of another heat dissipation assembly according to an embodiment of the present disclosure.

FIG. 19 is a diagram illustrating the structure of a heat dissipation assembly according to an embodiment of the present disclosure. FIG. 20 is a diagram illustrating the structure of another heat dissipation assembly according to an embodiment of the present disclosure. Referring to FIGS. 19 and 20, at least one of the first fluid cavity 211 or the second fluid cavity 212 includes a plurality of fluid sub-cavities 214.

The first fluid cavity 211 and the second fluid cavity 212 include the fluid sub-cavities 214. The fluid sub-cavities 214 implement the partitioned flow of the fluid in the first fluid cavity 211 and the second fluid cavity 212, guaranteeing different flow quantities and flow rates in different fluid sub-cavities 214, guaranteeing that the fluid in the fluid sub-cavities 214 at various positions in the heat dissipation assembly 210 dissipate the heat of the display panel 100 at appropriate flow quantities and flow rates, and improving the flow efficiency of the fluid in the heat dissipation assembly 210, that is, improving the effect of the heat dissipation performed by the heat dissipation assembly 210 on the display panel 100. In an embodiment, referring to FIG. 19, the first fluid cavity 211 is taken as an example for description. The first fluid cavity 211 includes multiple fluid sub-cavities 214. Arrows in the figure refer to flow directions of the fluid. That is, the partitioned flow of the fluid is implemented through the fluid sub-cavities 214. Similarly, referring to FIG. 20, the second fluid cavity 212 includes multiple fluid sub-cavities 214. Arrows in the figure refer to flow directions of the fluid. That is, the partitioned flow of the fluid flowing out of the heat dissipation assembly 210 is implemented. No specific limitations are made thereto in embodiments of the present disclosure.

Figure 21:
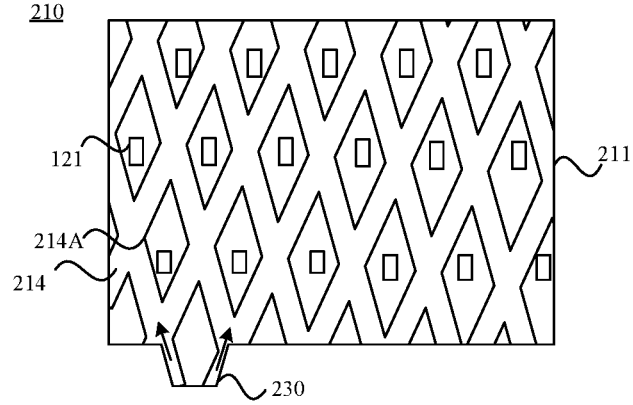
FIG. 21 is a diagram illustrating the structure of another heat dissipation assembly according to an embodiment of the present disclosure.

Further, FIG. 20 is a diagram illustrating the structure of another heat dissipation assembly according to an embodiment of the present disclosure. FIG. 21 is a diagram illustrating the structure of another heat dissipation assembly according to an embodiment of the present disclosure. Referring to FIGS. 20 and 21, the fluid sub-cavities 214 intersect each other to form a net structure. The net structure includes a plurality of hollow regions 214A. The hollow regions 214A expose pixel units in the display panel 100.

Figure 22:
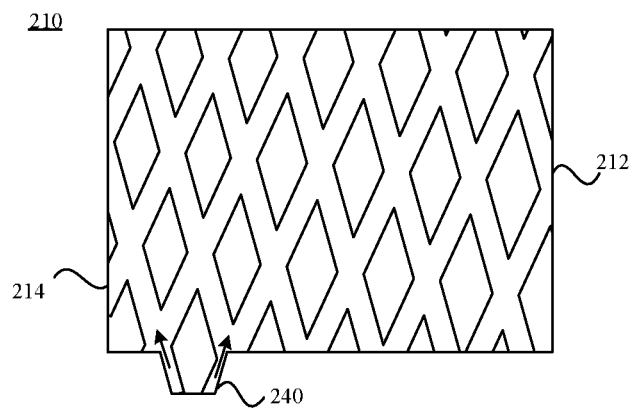

In an embodiment, the fluid sub-cavities 214 in the first fluid cavity 211 and the second fluid cavity 212 may be arranged in parallel as shown in FIG. 19. Multiple fluid sub-cavities 214 may also be arranged to intersect each other; that is, multiple fluid sub-cavities 214 are connected to form a net structure which also implements the partitioned flow of the fluid flowing in or out of the heat dissipation assembly 210. No specific limitations are made thereto in embodiments of the present disclosure. Further, referring to FIG. 21, the first fluid cavity 211 includes fluid sub-cavities 214 in a net-shaped connection. If the fluid sub-cavities 214 do not correspond to the pixel units 121 in the display panel 100, the hollow regions 214A formed by meshes of the net structure expose the pixel units, guaranteeing that the display and light emission of the pixel units 121 may not be blocked by the fluid sub-cavities 214, dissipating the heat of the display panel 100, and guaranteeing the display effect of the display panel 100. Further, referring to FIG. 22, the second fluid cavity 212 may also include fluid sub-cavities 214 in a net-shaped connection. No specific limitations are made thereto in embodiments of the present disclosure.

Figure 23:
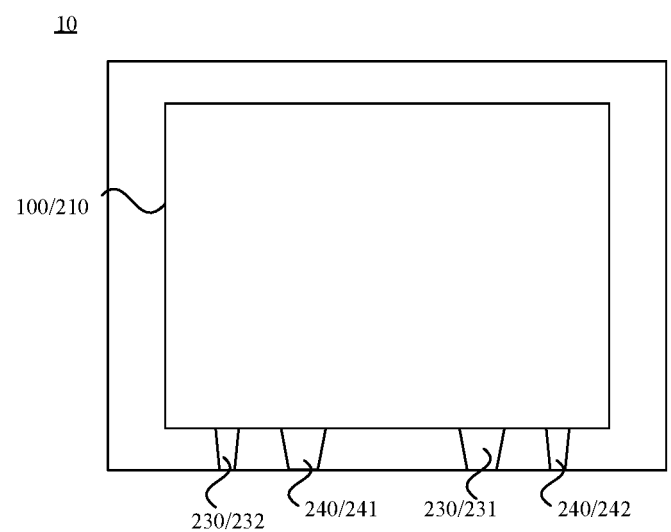
FIG. 23 is a top view illustrating the structure of another display device according to an embodiment of the present disclosure.

FIG. 23 is a top view illustrating the structure of another display device according to an embodiment of the present disclosure. Referring to FIG. 23, the at least one fluid inlet 230 includes a first fluid inlet 231 and a second fluid inlet 232. The sectional area of the first fluid inlet 231 is greater than the sectional area of the second fluid inlet 232. The at least one fluid outlet 240 includes a first fluid outlet 241 and a second fluid outlet 242. The sectional area of the first fluid outlet 241 is greater than the sectional area of the second fluid outlet 242.

The number of the at least one fluid inlet 230 and the number of the at least one fluid outlet 240 may be increased based on the requirements of flowing in or out of the heat dissipation assembly 210. As shown in FIG. 23, the at least one fluid inlet 230 includes the first fluid inlet 231 and the second fluid inlet 232. The at least one fluid outlet 240 includes the first fluid outlet 241 and the second fluid outlet 242. Further, the fluid has different flow rates at different positions of the heat dissipation assembly 210. That is, the adjustment and control of sectional areas of different fluid inlets 230 and fluid outlets 240 implements the balanced and stable flow of the fluid in the heat dissipation assembly 210, guaranteeing that the heat dissipation assembly 210 stably absorbs the heat generated in the display panel 100.

In an embodiment, as shown in FIG. 23, the sectional area of the first fluid inlet 231 is greater than the sectional area of the second fluid inlet 232. The sectional area of the first fluid outlet 241 is greater than the sectional area of the second fluid outlet 242. Thus a fluid inlet 230 and a fluid outlet 240 have different sectional areas, implementing different flow rates. No limitations are made to the number of the at least one fluid inlet 230, the number of the at least one fluid inlet 230, the sectional area of a fluid inlet 230, and the sectional area of a fluid outlet 240 in embodiments of the present disclosure.

With continued reference to FIG. 23, the second fluid inlet 232 is located on a side of the first fluid inlet 231 facing an edge of the first fluid cavity 211. The second fluid outlet 242 is located on a side of the first fluid outlet 241 facing an edge of the second fluid cavity 212.

In an embodiment, referring to FIG. 23, the sectional area of the first fluid inlet 231 is greater than the sectional area of the second fluid inlet 232. Moreover, the second fluid inlet 232 is located on a side of the first fluid inlet 231 facing the edge of the first fluid cavity 211. The first fluid inlet 231 is a fluid primary inlet. The second fluid inlet 232 is a fluid secondary inlet. The sectional area of the first fluid outlet 241 is greater than the sectional area of the second fluid outlet 242. Moreover, the second fluid outlet 242 is located on a side of the first fluid outlet 241 facing the edge of the second fluid cavity 212. The first fluid outlet 241 is a fluid primary outlet. The second fluid outlet 242 is a fluid secondary outlet. In other words, the fluid has a relatively small transmission volume in an edge region of the first fluid cavity 211 and in an edge region of the second fluid cavity 212. Thus the size of an inlet for transmitting the fluid and the size of an outlet for transmitting the fluid are relatively small, avoiding the case where a fluid vortex in the heat dissipation assembly 210 exists at the first fluid cavity 211 and the second fluid cavity 212, which is not conducive to timely heat dissipation. To guarantee the efficient and stable heat dissipation performed by the heat dissipation assembly 210 on the display panel 100, the sectional area of a fluid inlet 230 and the sectional area of a fluid outlet 240 are adjusted and controlled, where the fluid inlet 230 and the fluid outlet 240 are in different position regions.

With continued reference to FIGS. 1 and 4, the circulation cooling assembly 220 includes a first pipe 221, a fluid pump 223, and a second pipe 222. A first end 221A of the first pipe 221 is connected to the fluid inlet 230. A second end 221B of the first pipe 221 is connected to the fluid pump 223. A first end 222A of the second pipe 222 is connected to the fluid outlet 240. A second end 222B of the second pipe 222 is connected to the fluid pump 223. When working, the fluid pump 223 drives the fluid to be injected from the first pipe 221, through the fluid inlet 230, and into the first fluid cavity 211. After flowing through a surface on a side of the display panel 100, the fluid flows into the second fluid cavity 212, flows out of the fluid outlet 240, and enters the second pipe 222 so as to implement a fluid circulation.

The circulation cooling assembly 220 includes the first pipe 221 and the second pipe 222 and is connected to the heat dissipation assembly 210 through the first pipe 221 and the second pipe 222, implementing the heat dissipation of the display panel 100. In an embodiment, the first end 221A of the first pipe 221 is connected to the fluid inlet 230. The first end 222A of the second pipe 222 is connected to the fluid outlet 240. That is, the transmission path of the fluid between the circulation cooling assembly 220 and the heat dissipation assembly 210 is implemented.

Further, the circulation cooling assembly 220 also includes the fluid pump 223. The fluid pump 223 is connected to the second end 221B of the first pipe 221 and the second end 222B of the second pipe 222. That is, the first pipe 221 is connected to the second pipe 222 through the fluid pump 223. Moreover, the fluid pump 223 provides power for the fluid flowing in the first pipe 221 and the second pipe 222, guaranteeing the circulation of the fluid, thereby guaranteeing the circular flow of the fluid in the heat dissipation assembly 210, and dissipating the heat of the display panel 100 continuously.

Figure 24:
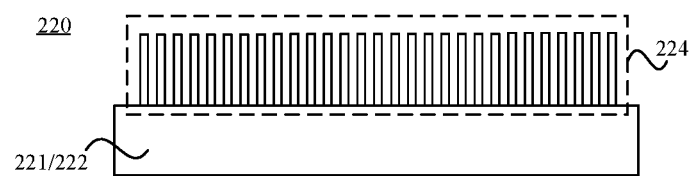
FIG. 24 is a diagram illustrating the structure of a circulation cooling assembly according to an embodiment of the present disclosure.

FIG. 24 is a diagram illustrating the structure of a circulation cooling assembly according to an embodiment of the present disclosure. Referring to FIGS. 1 and 24, at least one of the first pipe 221 or the second pipe 222 is provided with a heat dissipation fin 224.

The heat dissipation fin may also be referred to as a radiating fin and is classified as a "passive heat dissipation element" in the field of electronic engineering design. For the heat dissipation fin, metal with good thermal conductivity, light weight, and ease of processing, such as copper, is attached to a heating surface so that heat dissipation is implemented in a composite heat exchange mode. In an embodiment, referring to FIG. 24, the heat dissipation fin 224 is disposed on the first pipe 221 and/or the second pipe 222 and is used for timely dissipating the heat of the fluid flowing in the first pipe 221 and/or the second pipe 222. That is, the heat of the fluid generated in the display panel 100 and absorbed by the heat dissipation assembly 210 is dissipated through the heat dissipation fin 224.

The circulation heat dissipation assembly is not in contact with the display panel and is located outside the display panel. In other embodiments, the circulation heat dissipation assembly may further be provided with an active heat dissipation structure, for example, a structure like a heat dissipation fan. A specific implementation may be designed according to actual situations.

With continued reference to FIG. 1, at least one of the first pipe 221 or the second pipe 222 includes a plurality of bent structures.

In an embodiment, referring to FIG. 1, a region N in FIG. 1 is a bent structure existing in the first pipe 221. A plurality of bent structures may exist in the first pipe 221 and the second pipe 222. No specific limitations are made thereto in embodiments of the present disclosure. In an embodiment, the arrangement of the bent structures may reduce the space for the circulation cooling assembly 220, that is, save the arrangement space for the entire display device. Moreover, the bent structures may add the path for the fluid flow and be more beneficial to heat dissipation.

In an embodiment, the fluid includes a liquid or a gas.

The fluid is the heat dissipation medium flowing in the heat dissipation assembly 210 or the circulation cooling assembly 220 and may be a liquid or other, such as water and air. The fluid absorbs the heat of the display panel 100 in a manner of thermal conduction, that is, dissipates the heat of the display panel 100, so as to guarantee the normal operation of the display panel 100.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display device, comprising a display panel and a fluid heat dissipation module, wherein the fluid heat dissipation module comprises a circulation cooling assembly and at least one heat dissipation assembly;

wherein a heat dissipation assembly of the at least one heat dissipation assembly comprises a first fluid cavity adjacent to a first surface of the display panel and a second fluid cavity adjacent to a second surface of the display panel, and the first fluid cavity communicates with the second fluid cavity;

wherein the heat dissipation assembly comprises at least one fluid inlet disposed on an end of the first fluid cavity and at least one fluid outlet disposed on an end of the second fluid cavity, and a fluid inlet of the at least one fluid inlet and a fluid outlet of the at least one fluid outlet are each connected to the circulation cooling assembly; and wherein the display panel comprises a signal input terminal located on an end of the display panel, and in a direction perpendicular to a plane where the display panel is located, at least one of the fluid inlet or the fluid outlet at least partially overlaps the signal input terminal.

2. The display device according to claim 1, wherein signal input terminals comprise a first signal input terminal and a second signal input terminal, in the direction perpendicular to the plane where the display panel is located, the fluid inlet at least partially overlaps the first signal input terminal, and the fluid outlet at least partially overlaps the second signal input terminal.

3. The display device according to claim 1, wherein in the direction perpendicular to the plane where the display panel is located, at least one of the fluid inlet or the fluid outlet completely covers the signal input terminal.

4. The display device according to claim 2, further comprising a driver chip, wherein the first signal input terminal and the second signal input terminal are each electrically connected to the driver chip, and a projection of the driver chip on the display panel is located between a projection of the first signal input terminal on the display panel and a projection of the second signal input terminal on the display panel; and in the direction perpendicular to the plane where the display panel is located, at least one of the fluid inlet or the fluid outlet at least partially overlaps the driver chip.

5. The display device according to claim 1, wherein a number of signal input terminals is a, a number of the at least one fluid inlet is b, a number of the at least one fluid outlet is c, and a=b+c, wherein a is an integer greater than 2, b is an integer greater than or equal to 1, and c is an integer greater than or equal to 1.

6. The display device according to claim 1, wherein the first fluid cavity comprises a first end and a second end which are disposed opposite to each other in a first direction, and the second fluid cavity comprises a third end and a fourth end which are disposed opposite to each other in the first direction;

the fluid inlet is connected to the first end of the first fluid cavity, the fluid outlet is connected to the third end of the second fluid cavity, and the second end of the first fluid cavity communicates with the fourth end of the second fluid cavity; and the first end of the first fluid cavity and the third end of the second fluid cavity are each adjacent to a first end of the display panel, and the second end of the first fluid cavity and the fourth end of the second fluid cavity are each adjacent to a second end of the display panel.

7. The display device according to claim 6, wherein a fifth end of the first fluid cavity communicates with a sixth end of the second fluid cavity, the fifth end of the first fluid cavity is adjacent to the second end of the first fluid cavity, and the sixth end of the second fluid cavity is adjacent to the fourth end of the second fluid cavity.

8. The display device according to claim 1, wherein the first fluid cavity communicates with the second fluid cavity integrally, and the first fluid cavity and the second fluid cavity are connected to each other and form an accommodation structure in which at least a partial region of the display panel is placed.

9. The display device according to claim 1, wherein a communication position between the first fluid cavity and the second fluid cavity comprises a plurality of communication pipes.

10. The display device according to claim 9, wherein at least two communication pipes of the plurality of communication pipes have different sectional areas in a first section, wherein the first section is perpendicular to an extension direction of the plurality of communication pipes; and wherein in a direction perpendicular to the extension direction of the plurality of communication pipes, sectional areas of the plurality of communication pipes increase in sequence along a direction from two sides of the communication position to a center of the communication position.

11. The display device according to claim 1, wherein at least one of the first fluid cavity or the second fluid cavity comprises a plurality of fluid sub-cavities; and wherein the plurality of fluid sub-cavities intersect each other to form a net structure, the net structure comprises a plurality of hollow regions, and the plurality of hollow regions expose pixel units in the display panel.

12. The display device according to claim 1, wherein the at least one fluid inlet comprises a first fluid inlet and a second fluid inlet, and a sectional area of the first fluid inlet is greater than a sectional area of the second fluid inlet;

the at least one fluid outlet comprises a first fluid outlet and a second fluid outlet, and a sectional area of the first fluid outlet is greater than a sectional area of the second fluid outlet; and the second fluid inlet is located on a side of the first fluid inlet facing an edge of the first fluid cavity, and the second fluid outlet is located on a side of the first fluid outlet facing an edge of the second fluid cavity.

13. A display device, comprising a display panel and a fluid heat dissipation module, wherein the fluid heat dissipation module comprises a circulation cooling assembly and at least one heat dissipation assembly;

wherein a heat dissipation assembly of the at least one heat dissipation assembly comprises a first fluid cavity adjacent to a first surface of the display panel and a second fluid cavity adjacent to a second surface of the display panel, and the first fluid cavity communicates with the second fluid cavity;

wherein the heat dissipation assembly comprises at least one fluid inlet disposed on an end of the first fluid cavity and at least one fluid outlet disposed on an end of the second fluid cavity, and a fluid inlet of the at least one fluid inlet and a fluid outlet of the at least one fluid outlet are each connected to the circulation cooling assembly; and wherein the circulation cooling assembly comprises a first pipe, a fluid pump, and a second pipe, a first end of the first pipe is connected to the fluid inlet, a second end of the first pipe is connected to the fluid pump, a first end of the second pipe is connected to the fluid outlet, and a second end of the second pipe is connected to the fluid pump; and when working, the fluid pump drives a fluid to be injected from the first pipe, through the fluid inlet, and into the first fluid cavity; and after flowing through a surface on a side of the display panel, the fluid flows into the second fluid cavity, flows out of the fluid outlet, and enters the second pipe so as to implement a fluid circulation.

14. The display device according to claim 1, wherein the first fluid cavity is a transparent structure and is disposed adjacent to a light exiting surface of the display panel.

15. The display device according to claim 1, wherein the first fluid cavity and the second fluid cavity are each a transparent structure, and the display panel is a transparent display panel.

16. The display device according to claim 15, wherein the display panel is a self-luminous display panel, and the self-luminous display panel comprises a plurality of light-emitting elements; and wherein the plurality of light-emitting elements comprise at least one of organic light-emitting diodes, submillimeter light-emitting diodes, or micro light-emitting diodes.

17. The display device according to claim 13, wherein at least one of the first pipe or the second pipe is provided with a heat dissipation fin.

18. The display device according to claim 13, wherein at least one of the first pipe or the second pipe comprises a plurality of bent structures.

19. The display device according to claim 13, wherein the fluid comprises a liquid or a gas.

* * * * *